United States Patent [19]

Reeds, Jr.

[11] 4,263,514
[45] Apr. 21, 1981

[54] ELECTRON BEAM SYSTEM

[75] Inventor: John W. Reeds, Jr., Thousand Oaks, Calif.

[73] Assignee: Hughes Aircraft Company, Culver City, Calif.

[21] Appl. No.: 75,354

[22] Filed: Sep. 13, 1979

[51] Int. Cl.³ .................................. H01J 37/147
[52] U.S. Cl. .................... 250/492 A; 250/398
[58] Field of Search ............ 250/492 A, 398, 396 R, 250/396 ML, 311; 219/121 EB, 121 EM; 313/359, 361

[56] References Cited

U.S. PATENT DOCUMENTS

| | | | |
|---|---|---|---|
| 3,956,635 | 5/1976 | Chang | 250/492 A |
| 3,978,338 | 8/1976 | Ueno | 250/396 R |
| 4,013,891 | 3/1977 | Ko et al. | 250/492 A |
| 4,112,305 | 9/1978 | Goto et al. | 250/398 |

Primary Examiner—Bruce C. Anderson
Attorney, Agent, or Firm—Allen A. Dicke, Jr.; W. H. MacAllister

[57] ABSTRACT

Electron beam lens 22 can be operated in a first mode to demagnify and focus the image of electron source 14 at image plane 32. Electron optical lens 34 and 46 further demagnify the image plate 32 through the focal point 60 on the face of target 58 to provide a scannable exposure spot. Electron optical lens 22 can be operated in the second mode which floods aperture 32 so that the image of the aperture is demagnified and focused on target 58 to provide a large exposure area.

13 Claims, 4 Drawing Figures

ELECTRON BEAM SYSTEM

BACKGROUND

This invention is directed to an electron beam system where the system is capable of selectively producing either a small round electron beam spot on a target or a larger square electron beam spot on the target. When used for electron beam lithography, the small spot is used for exposing fine pattern structures and the larger square electron spot is for exposing larger areas.

When writing with an electron beam on a target, such as exposing photolithographic sensitive material, a small beam size is capable of writing fine structures, but takes a long time to fill-in large areas. Conversely, if a large electron beam is used, large areas can be rapidly filled-in but fine structures cannot be detailed. A previously known method provides a completely variable square or rectangular spot size. However, this requires an extremely complex electron-optical system as well as complex computer software. This is described by Pfeiffer "Variable Spot Shaping for Electron Beam Lithography"Fourteenth Symposium on Electron, Ion and Photon Beam Technology, May 1977. Another system produces only a fixed size square probe and is not suitable for exposing structures requiring finest detail. This system is described in the IBM Journal of Research and Development, November 1977, pages 498–521.

SUMMARY

In order to aid in the understanding of this invention it can stated in essentially summary form that is directed to an electron beam system for projecting an electron spot, with the system being capable of selectively projecting a small spot or a larger spot. To accomplish this, a first electron lens can be operated either in a flood mode or a focus mode. An aperture is positioned at the focal point of the lens when it is operating in the focus mode, and this aperture is flooded when the lens is operating in the flood mode. Downstream optics demagnify the image at the aperture plane and direct the image onto a target.

It is thus an object of this invention to provide an electron beam system which is capable of operation with a small spot on the target or a larger area on the target. It is another object to provide an electron beam system capable of operating in a small spot mode or a larger area exposure mode with the change of operating parameters of only one lens in the electron optical system. It is a further object to provide an electron beam system which is capable of being easily programed for selectively producing a small round electron exposure beam for exposing fine patterned details, or a larger square electron beam on the target for exposing larger areas.

It is another object to provide an electron beam system wherein minimized exposure time together with rapid completion of the exposure tasks, together with detailed exposure of fine structures is accomplished.

Other objects and advantages of this invention will become apparent from a study of the following portions of this specification, the claims and the attached drawings.

DESCRIPTION OF THE PREFERRED EMBODIMENT

Figure 1:
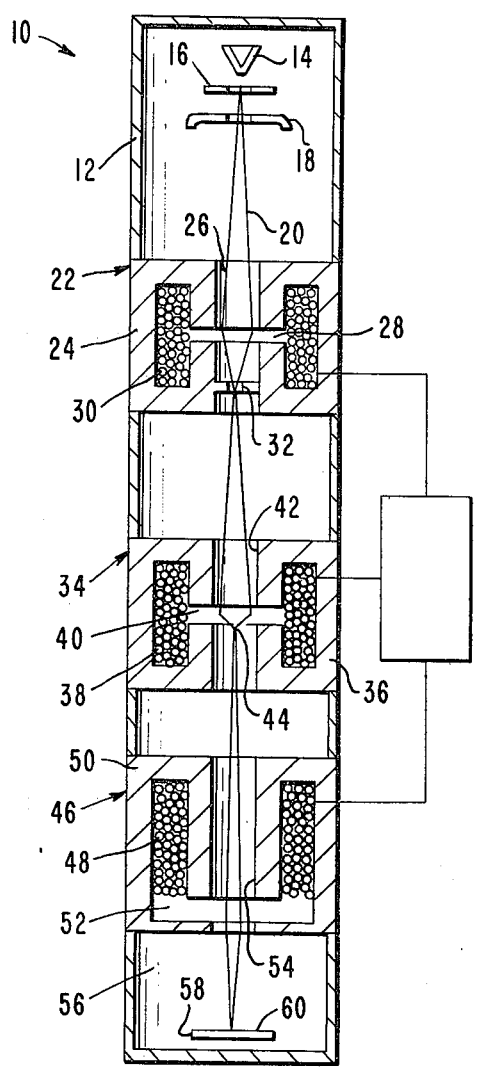
FIG. 1 is a longitudinal sectional view of a preferred embodiment of the electron beam system of this invention.
Figure 2:
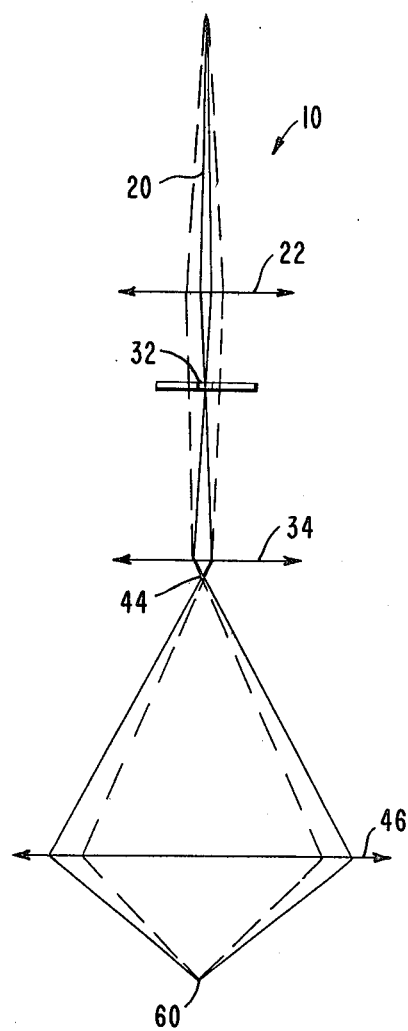
FIG. 2 is a schematic beam trace of electron beams in the system of this invention.

The electron beam system of the preferred embodiment of this invention is generally indicated at 10 in FIGS. 1 and 2. FIG. 1 illustrates a practical embodiment of the system while FIG. 2 illustrates a schematic construction with a simplified ray trace of the electron beam paths. In FIG. 1, housing 12 is vacuum tight to permit the electron source and beam to operate in a vacuum. Electron source 14 emits electrons. Grid 16 is provided a control beam intensity and anode 18 has a positive potential applied thereto to accelerate the beam. Beam 20 is the beam accelerated by the anode.

First electronoptical lens 22 has an iron core 24 which has central passageway 26 and magnetic gap 28 along the central passageway. Electromagnet core 30 is energized to provide a magnetic field in gap 28. The magnetic field serves as a magnetic focussing lens for beam 20.

Aperture 32 is located at the focal point of lens 22 when the lens is operated in a first, or small spot mode. In the first mode the image of electron surce 14 as focussed as a small spot at the image plane at the level of aperture 32. Thus, aperture 32 is positioned at the point where the first lens 22 focusses the image of electron source 14 when operated in the first mode. This mode is shown in solid lines in FIGS. 1 and 2.

When operating in the second mode, aperture 32 is flooded. Thus, the image of the flooded aperture 32 is seen at the image plane at a down stream position.

Second electron optical lens 34 is the same as first lens 22. It has iron core 36, electromagnetic coil 38 and magnetic field gap 40 around central passage 42. The purpose of saecond electron optical lens 34 is to focus and demagnify the image at the image plane of aperture 32. This image is focussed at focal plane 44.

Third electron optical lens 46 is positioned in the column in housing 12 below second electron optical lens 34. Third lens 46 is constructed similarly to the lenses 22 and 34. It has electro magnetic coil 48 located with respect to iron core 50 which has magnetic field gap 52. Central passage 54 is open through lens 46 to allow passage of the beam 20. Lens 46 also demagnefies the beam. Target chamber 56 is at the bottom of column 12 and is for containing target 58 which has its top surface at the final focal plane 60 of beam 20. Target chamber 56 preferably contains beam scanning equipment, such as electrostatic deflection plates for deflecting the beam in accordance with a desired path to expose the desired pattern.

In the present structure, the approximately 20 micron diameter electron source 14 is imaged at image plane 32 to a 4 micron diameter by lens 22 when the lens is operated in its fine focussing mode. The 4 micron diameter image seen at image plane 32 by second lens 34 is demagnetified to focal plane 44 to a 0.2 micron diameter. That image is demagnified by lens 46 to form a 0.1 micron round electron beam on the target.

By reducing the energization of the coil in lens 22, the 20 micron source is defocussed to flood the 40 micron square aperture 32. With no changes in the excitation of lenses 34 and 46, the beam at target 58 becomes a 1 micron square beam. With the reduction in the excitation of lens 22, the electron current automatically increases by a factor of 50 to 100 thus allowing the 1 micron square beam to expose large pattern areas much more rapidly than the small beam. Changing the demagnification of lens 34 will allow both the small round beam and the large square to be each proportionally changed in size as required. However, it is contemplated in most programs that during beam scan in the x and y direction across target 58, only the change in focus drive of lens 22 from the small round beam to the larger square beam will be required.

It is contemplated that the principle use of the electron beam system of this invention will be for the exposing of masks used in semiconductor processing. These masks have electron sensitive material thereon, and with patterned exposure followed by development, serve as masks for the exposure of resist on semiconductor wafers. By the present electron beam system accurate and finely detailed lithography is achieved. In special cases, the system can be used for the direct exposure of a resist on a wafer for experimental semiconductor wafer production or for other one of a kind wafer production. The advantages of electron beam lithography over light optical techniques include better resolution, fast cycling, improved alignment capability, large pattern capability and control over defects through computer drive of the pattern.

Figure 3:
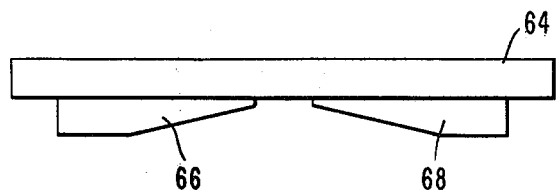
FIG. 3 is a side elevational view of an adjustable aperture for use in the system of FIG. 1.
Figure 4:
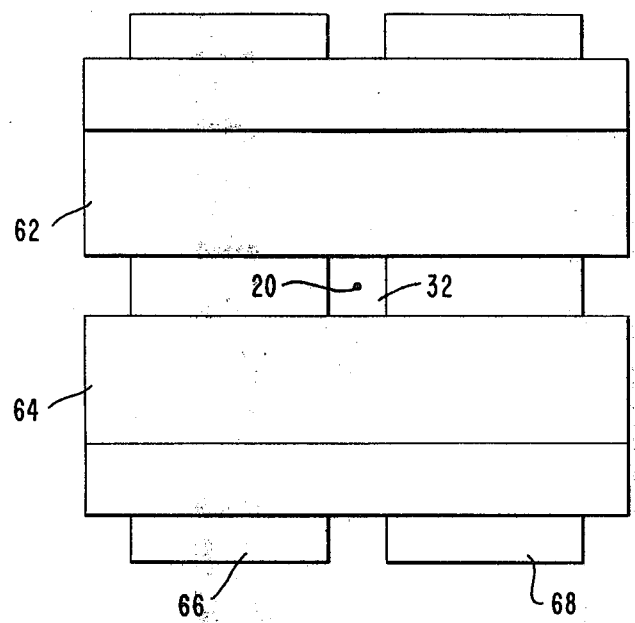
FIG. 4 is a plan view of the aperture structure.

FIGS. 3 and 4 illustrate that aperture 32 is defined by two upper blades 62 and 64 and two lower blades 66 and 68. These blades are mounted together and each is beveled, with the bevels of blades 66 and 68 best illustrated in FIG. 3. The sharp edges of the blades, that is the beveled edges, face aperture 32 so that a minimum thickness of the blades is present at the aperture. The blades are preferably mounted so that they can be adjusted to the desired aperture size, and then clamped in place.

Since the first electron optical lens 22 is to be rapidly changed from its first focus mode to its second flood mode rapidly under computer control, it may be desirable to employ an electrostatic lens rather than an electromagnetic lens at that location. Since lenses 34 and 46 are not changed in magnification during the processing, electromagnetic lenses are preferred at those locations, as illustrated although electro static lenses could be employed instead.

This invention has been described in its presently contemplated best mode and it is clear that it is susceptible to numerous modifications, modes and embodiments within the ability of those skilled in the art and without the exercise of the inventive faculty. Accordingly, the scope of this invention is defined by the scope of the followng claims.

I claim:

1. An electron beam system comprising an electron source;
   means for accelerating electrons from said source to form a beam moving along a beam path;
   first and second electron optical lenses positioned along said beam path;
   means for operating said first lens in a first mode to form an image of said electron source at a first focal plane;
   an aperture at said first focal plane larger than the image of said source at said first focal plane, said means for operating said first lens in a first mode being also for selectively operating said first lens in a second mode in which said aperture is flooded with electrons to form an image of said aperture; and
   means for focusing said image at said first focal plane onto a target plane.

2. The electron beam system of claim 1 wherein said means for focusing the image at said first focal plane onto a target plane comprises at least one electron optical lens.

3. The electron beam system of claim 2 wherein said means for focusing the image at said first focal plane onto said target plane comprises means for demagnifying the image at said first focal plane so that the electron beam at said target plane is smaller than at said first focal plane.

4. The electron beam system of claim 3 wherein said means for focusing the image at said first focal plane onto said target plane comprises second and third electron optical lenses, both said second and third electron optical lenses being for demagnifying the image at said first focal plane.

5. The electron beam system of claim 4 wherein said second and third electron optical lenses are electromagnetic lenses.

6. An electron beam system comprising an electron source;
   means for accelerating electrons from said source to form a beam moving along a beam path;
   first and second electron optical lenses positioned along said beam path;
   means for operating said first lens in a first mode to form an image of said electron source at a first focal plane;
   an aperture at said first focal plane larger than the image of said source at said first focal plane, said means for operating said first lens in a first mode being also for selectively operating said first lens in a second mode in which said aperture is flooded with electrons to form an image of said aperture; and
   means for focusing said image at said first focal plane onto a target plane, comprising means for demagnifying the image at said first focal plane so that the electron beam at said target plane is smaller than at said aperture at said first focal plane.

7. The electron beam system of claim 6 wherein said means for focusing the image at said first focal plane onto said target plane comprises second and third electron optical lenses, both said second and third electron optical lenses being for demagnifying the image at said first focal plane.

8. The electron beam system of claim 7 wherein said second and third electron optical lenses are electromagnetic lenses.

9. The electron beam system of claim 8 wherein said aperture at said first focal plane is formed of a first pair of facing blades and a second pair of facing blades, said first pair of facing blades being upper blades and said second pair of facing blades being below said first pair of facing blades.

10. The electron beam system of claim 9 wherein each of said blades has a beveled edge and said beveled edges of said pairs of blades face each other.

11. The electron beam system of claim 1 wherein said aperture at said first focal plane is formed of a first pair of facing blades and a second pair of facing blades, said first pair of facing blades being upper blades in said second pair of facing blades both being below said first pair of facing blades.

12. The electron beam system of claim 11 wherein each of said blades has a beveled edged and said beveled edges of said pairs of blades face each other.

13. The method of exposing a pattern comprising the steps of:
    coating a base with a electron sensitive material to receive the exposure pattern;
    exposing small areas of the electron sensitive material with a focused electron beam from an electron optical system having an electron source, followed by first and second electron optical lenses along the beam path with an aperture between the lenses, with the demagnified image of the source forming a small beam spot on the electron sensitive material which is scanned along the electron sensitive material for exposure in a first mode; and
    exposing the electron sensitive material in a second mode by flooding the aperature by defocusing the first electron optical lens and focusing and demagnifying the image of the aperture on the electron sensitive material with the second electron optical lens to provide a larger beam spot on the electron sensitive material and scanning the larger beam spot in the second mode over the electron sensitive material to expose larger areas of the electron sensitive material.

* * * * *